(12) United States Patent
Heim et al.

(10) Patent No.: US 9,354,263 B2
(45) Date of Patent: May 31, 2016

(54) MEASURING DEVICE AND METHOD FOR THE DETECTION OF AN APPROACH

(75) Inventors: Axel Heim, München (DE); Artem Ivanov, Lundshut (DE); Roland Aubauer, Wessling (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 189 days.

(21) Appl. No.: 14/007,073

(22) PCT Filed: Mar. 22, 2012

(86) PCT No.: PCT/EP2012/055095
§ 371 (c)(1),
(2), (4) Date: May 1, 2014

(87) PCT Pub. No.: WO2012/126992
PCT Pub. Date: Sep. 27, 2012

(65) Prior Publication Data
US 2014/0232418 A1    Aug. 21, 2014

(30) Foreign Application Priority Data
Mar. 24, 2011 (DE) .......................... 10 2011 006 079

(51) Int. Cl.
*G01R 27/26* (2006.01)
*G06F 1/16* (2006.01)
*H03K 17/955* (2006.01)
*H03K 17/96* (2006.01)

(52) U.S. Cl.
CPC .......... *G01R 27/2605* (2013.01); *G06F 1/1626* (2013.01); *H03K 17/955* (2013.01); *H03K 17/962* (2013.01); *H03K 2217/96071* (2013.01); *H03K 2217/960755* (2013.01)

(58) Field of Classification Search
None
See application file for complete search history.

(56) References Cited

U.S. PATENT DOCUMENTS

| | | | |
|---|---|---|---|
| 7,521,942 B2 | 4/2009 | Reynolds | 324/688 |
| 9,124,273 B2 | 9/2015 | Unterreitmayer | |
| 2008/0278178 A1* | 11/2008 | Philipp | G06F 3/044 |
| | | | 324/662 |
| 2010/0177058 A1 | 7/2010 | Lin | 345/174 |

(Continued)

FOREIGN PATENT DOCUMENTS

| | | | |
|---|---|---|---|
| DE | 10049411 A1 | 4/2002 | G06F 1/16 |
| DE | 102009057933 B3 | 2/2011 | G01D 5/24 |
| JP | 2009-508086 A | 2/2009 | G01B 7/00 |

(Continued)

OTHER PUBLICATIONS

European Office Action, Application No. 127142854.5, 3 pages, Dec. 23, 2014.

(Continued)

*Primary Examiner* — Minh N Tang
(74) *Attorney, Agent, or Firm* — Slayden Grubert Beard PLLC (57) ABSTRACT

A capacitive measuring device for a hand-held device, particularly an electric hand-held device for the detection of an approach to the hand-held device, has a switching device, wherein the ground of the capacitive measuring device is galvanically connectable with an electrically conductive structure of the hand-held device by a switching device, and wherein the capacitive measuring device has a ground electrode structure with at least one ground electrode that can be arranged on the hand-held device, wherein the ground of the capacitive hand-held device is galvanically connectable with the at least one ground electrode by the switching device.

20 Claims, 3 Drawing Sheets

(56) References Cited

U.S. PATENT DOCUMENTS

2011/0216035 A1* 9/2011 Shih ..................... G06F 3/045
  345/174
2013/0057299 A1 3/2013 Unterreitmayer ............. 324/629

FOREIGN PATENT DOCUMENTS

| JP | 2013-513840 A | 4/2013 | ............... G01B 7/00 |
| WO | 2009/090704 A1 | 7/2009 | ............... G06F 15/02 |
| WO | 2012/126992 A2 | 9/2012 | ............... G06F 1/16 |

OTHER PUBLICATIONS

International Search Report and Written Opinion, Application No. PCT/EP2012/055095, 9 pages, Sep. 7, 2012.

Japanese Office Action, Application No. 2014-500391, 7 pages, Feb. 8, 2016.

\* cited by examiner

MEASURING DEVICE AND METHOD FOR THE DETECTION OF AN APPROACH

FIELD OF THE INVENTION

The invention relates to a capacitive measuring device for a hand-held device, particularly an electric hand-held device, for the detection of an approach of a hand to the hand-held device. Furthermore the invention relates to a method for the detection of an approach of a hand to a hand-held device, particularly an electric hand-held device, with a capacitive measuring device according to the invention.

STATE OF THE ART AND BACKGROUND OF THE INVENTION

Hand-held devices, particularly electric hand-held devices, are increasingly provided with capacitive sensors for detecting an approach of a hand to the hand-held device or a contact of the hand-held device by a hand. Providing additional interaction possibilities to operate a hand-held device constitutes the background of the approach or contact detection. Thereby, the usability of a hand-held device is to be enhanced or facilitated.

Arranging sensor electrodes of a capacitive sensor device on a sensor surface of a hand-held device is known from the state of the art. This sensor surface provides an interaction area, by which the hand-held device can receive the user inputs. The user inputs can be caused for example by the contact of the sensor surface and/or by an approach of a hand to the sensor surface. Under the sensor surface, a large-area emitter electrode (transmitting electrode) can be arranged, with which an alternating electric field can be stimulated. The signal detected by means of the sensor electrodes of the sensor surface or the data derived therefrom are related to the distance of an object, for example a finger, from the sensor electrodes.

However, it is a disadvantage that when the hand-held device is held in a hand, the position of a fingertip, for example the tip of the thumb, relative to the sensor surface can not be determined with the necessary accuracy when, for example, the thumb extends laterally into the sensor surface. For a multitude of applications though, a specific determination of the position of a fingertip relative to the sensor surface is a necessary prerequisite.

When a finger, for example a thumb of the hand that holds the hand-held device, moves within the sensor surface area, the alternating electric field surrounding the surface is distorted. However, with the same position of the tip of the thumb, the distortion of the alternating electric field depends on which side the thumb extends into the sensor surface. In order to take into account these different distortions of the alternating electric field of the sensor surface when determining the position of a fingertip, for example of a thumb, relative to the sensor surface, it is necessary to know in which hand the hand-held device is held. Therefore, for a correct determination of the position of a fingertip relative to the sensor surface, it must be additionally detected whether the hand-held device is held in the left hand or in the right hand.

In the state of the art, the hand position, that is, whether the hand-held device is held in the right hand or in the left hand, is not considered when detecting the position of a fingertip in relation to the sensor surface. For a multitude of applications it is not possible therefore to detect the position of the fingertip relative to the sensor surface with the necessary accuracy. In the state of the art it has been attempted to face this problem by predetermining the operation by means of the shape of the housing of the hand-held device. For example, the shape of the housing of a hand-held device can be designed in such a way that it can only be operated with the right hand or only with the left hand. The operation or the easiness of use of the hand-held device is thus considerably limited.

OBJECT OF THE INVENTION

The object of the invention is therefore to provide a capacitive measuring device, as well as a method for detecting an approach of a hand to a hand-held device or for detecting if the hand-held device is held by a hand, with which the detection of a fingertip position relative to a sensor surface of the hand-held device can be enhanced.

SOLUTION ACCORDING TO THE INVENTION

This problem is solved according to the invention by means of a capacitive measuring device for a hand-held device and a method for the detection of an approach of a hand to a hand-held device according to the independent claims. Advantageous designs and embodiments of the invention are indicated in the respective dependent claims. Furthermore, a hand-held device, particularly an electric hand-held device, which has a capacitive measuring device according to the invention, is also part of the solution.

A capacitive measuring device for a hand-held device is therefore provided, particularly an electric hand-held device for detecting an approach to the hand-held device, wherein
  the capacitive measuring device has a switching device,
  the ground of the capacitive measuring device is galvanically connectable to an electrically conductive structure of the hand-held device by means of the switching device, and
  the capacitive measuring device comprises a ground electrode structure with at least one ground electrode that can be arranged on the hand-held device, where the ground of the capacitive measuring is galvanically connectable to the at least one ground electrode by means of the switching device.

The switching device can be designed in such a way that either the electrically conductive structure and/or at least one ground electrode of the ground electrode structure are galvanically connected to the ground of the capacitive measuring device. It can also be envisaged that neither the electrically conductive structure, nor the ground electrodes of the ground electrode structure are galvanically connected with the ground of the capacitive measuring device.

The ground electrode structure can comprise a first ground electrode and a second ground electrode, which are placed on the hand-held device, preferably in a housing of the hand-held device, particularly preferably inside a housing shell of the hand-held device, in such a way that when the hand-held device is held with a hand, at least one of the two ground electrodes is at least partially covered by that hand.

The switching device can be provided with a switch both for every ground electrode of the ground electrode structure and for the electrically conductive structure.

Every ground electrode of the ground electrode structure can be provided with a coupling capacitance $C_M$, $C_L$, $C_R$ for the electrically conductive structure. The ground electrodes and/or the arrangement of the ground electrodes relative to the electrically conductive structure must be chosen in such a way that the coupling capacitances $C_M$, $C_L$, $C_R$ are as low as possible.

The capacitive measuring device can have a reference capacitance $C_{REF}$, which is galvanically connected with the electrically conductive structure and is galvanically connectable with a switch that comprises a switching element with the ground of the capacitive measuring device.

Preferably, the reference capacitance $C_{REF}$ and the coupling capacitances $C_M$, $C_L$, $C_R$ are substantially equal.

Furthermore, a method for detecting an approach of a hand to a hand held-device, particularly an electric hand-held device, with a capacitive measuring device, particularly a capacitive measuring device according to the invention, is provided, in which the capacitive measuring device has a ground electrode structure with at least one ground electrode and at least one sensor electrode and wherein in a first measurement cycle, the ground of the capacitive measuring device is galvanically connected with an electrically conductive structure of the hand-held device and first sensor signals are detected in the at least one sensor electrode, in a second measurement cycle, the ground of the capacitive measuring device is galvanically connected with at least one ground electrode of the ground electrode structure and second sensor signals are detected in the at least one sensor electrode, and the difference between the signal levels of the first sensor signals and the second sensor signals are determined, the difference determined being indicative of the approach of a hand to the hand-held device.

The ground electrode structure can be provided with a first ground electrode and a second ground electrode that are positioned in the hand-held device in such a way that when holding the hand-held device with a hand, at least one of the two ground electrodes is at least partially covered by said hand, wherein in the second measurement cycle firstly, the first ground electrode is galvanically connected with the ground of the capacitive measuring device, and the second sensor signals $DS2_L$ associated to the first ground electrode are detected in the at least one sensor electrode, subsequently, the second ground electrode is galvanically connected with the ground of the capacitive measuring device and the second sensor signals $DS2_R$ associated to the second ground electrode are detected in the at least one sensor electrode, and a first difference between the signal levels of the second sensor signals $DS2_L$ associated to the first ground electrode and of the first sensor signals $DS1$, i.e. $DS2_L-DS1$, is compared with a second difference between the signal levels of the second sensor signals $DS2_R$ associated to the second ground electrode and of the first sensor signals $DS1$, i.e. $DS2_R-DS1$, wherein a difference between the first difference and the second difference, i.e. $(DS2_L-DS1)-(DS2_R-DS1)$, is indicative of which of the two ground electrodes is covered by the hand.

Preferably, the electrically conductive structure is connectable, at least in the second measurement cycle, with the ground of the capacitive measuring device by means of the reference capacitance $C_{REF}$.

The ground electrodes $E_M$, $E_L$, $E_R$ of the ground electrode structure can be respectively provided with a coupling capacitance $C_M$, $C_L$, $C_R$ to the electrically conductive structure. The ground electrodes and/or the arrangement of the ground electrodes relative to the electrically conductive structure are chosen in such a way that the coupling capacitances $C_M$, $C_L$, $C_R$ are as low as possible.

The reference capacitance $C_{REF}$ and the coupling capacitances $C_M$, $C_L$, $C_R$ can be chosen in such a way that they are substantially equal.

The ground electrodes, the reference capacitance and the electrically conductive structure can be respectively connectable by means of a switch, which comprises a switching element and a parasitic capacitance parallel to the latter, with the ground of the capacitive measuring device, wherein the switch is preferably chosen in such a way that its capacitances are significantly lower than the coupling capacitances.

In a calibration step, the electrically conductive structure can be connected with the ground of the capacitive measuring device by means of the reference capacitance, and the third sensor signals are detected in the at least one electrode sensor, which are used as a reference sensor for at least one ground electrode, wherein a signal level of the second sensor signal associated to the at least one ground electrode is indicative of an approach to the at least one ground electrode, if the difference between the signal level of the first sensor signal and that of the third sensor signal is higher in magnitude than the difference between the signal level of the first sensor signal and that of the second sensor signal.

At least a third sensor signal can be corrected by a tolerance value.

The hand-held device or the electric hand-held device can be, for example, a smartphone, a mobile radio unit, a remote control device, a digital camera, particularly a digital camera with a touchscreen, a game controller or a game console with touchscreen, a portable minicomputer, a tablet PC, or similar.

BRIEF DESCRIPTION OF THE FIGURES

Other details and characteristics of the invention, as well as examples of embodiments of the invention, will become apparent from the following description taken in conjunction with the drawings, in which.

DETAILED DESCRIPTION OF THE INVENTION

Figure 1A:
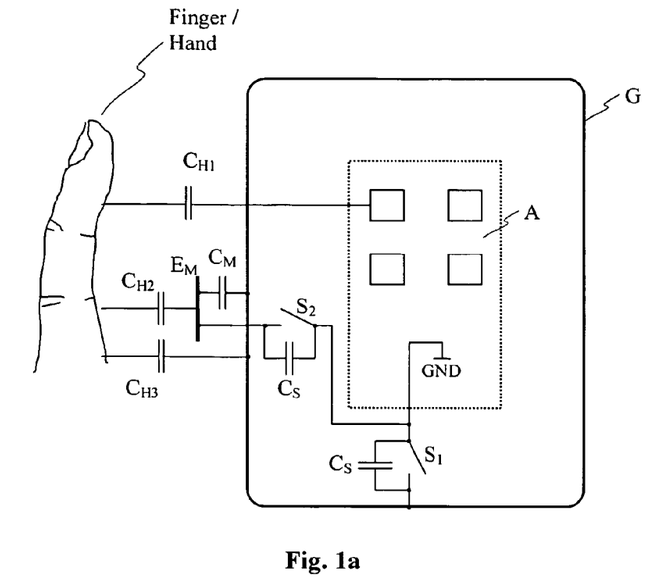
FIG. 1a shows an equivalent-circuit diagram of a capacitive measuring device according to the invention for an electric hand-held device.

FIG. 1a shows an equivalent-circuit diagram of a capacitive measuring device according to the invention for a hand-held device for the detection of an approach to the hand-held device. The hand-held device has a sensor surface A where a number of sensor electrodes (measuring electrodes) can be arranged. With the sensor electrodes it is possible to determine, for example, the position of a fingertip relative to the sensor surface A. In this case, it is possible to detect the approach of a fingertip to the sensor surface A or the contact of the sensor surface with a fingertip. The sensor electrodes of the sensor surface as well as an emitter electrode (transmitting electrode), which can be designed for example as a large-area electrode and can be arranged under the sensor electrodes, are connected with a capacitive measuring device. The electrically conductive housing or an electrically conductive housing layer of the electric hand-held device can be connected with the ground of the capacitive measuring device. The housing layer can comprise an electrically conductive structure G, as shown in FIG. 2b.

In the hand-held device a ground electrode $E_M$ is additionally arranged, which is also connectable with the capacitive measuring device. The ground electrode $E_M$ is arranged in the hand-held device preferably in such a way that when the hand-held device is held by a hand, the device is covered at least partially by that hand. Furthermore, the surface of the ground electrode $E_M$ is considerably larger or considerably smaller than the electrically conductive structure G of the hand-held device. Preferably it is substantially smaller than the electrically conductive structure G. In the following specified raw values or measured variables and formulas or calculations it is assumed that the surface of the ground electrode $E_M$ is substantially smaller than the electrically conductive structure G. The specified raw values or measured variables and formulas or calculations are also valid in the case of the surface of the ground electrode $E_M$ being considerably larger than the electrically conductive structure G, in which case though the algebraic signs of the measured variables change.

Sensor signals that correlate with the position of a fingertip relative to the sensor surface are detected in the sensor electrodes of the sensor surface A. In the normal operation of the electric hand-held device or the capacitive measuring device, the electrically conductive structure G of the housing or that of the hand-held device is galvanically connected with the ground of the capacitive measuring device. The connection of the electrically conductive structure G with the ground of the capacitive measuring device can be carried out, for example, by means of a switch $S_1$ of a switching device.

The detection of an approach to the hand-held device according to the invention takes place essentially in two successive measurement cycles, the detection being carried out several times. The time interval between both measurement cycles is preferably chosen in such a way that it can be assumed that a finger does not move in the area of the sensor surface A between the two cycles, that is, a movement of the finger relative to the sensor surface A is not recognized as such and does not influence in the detection. This means that the time interval between both measurement cycles is preferably chosen to be very small.

In a first measurement cycle, sensor signals are detected in the sensor electrodes of the sensor surface A when the switch $S_1$ is closed, i.e. the electrically conductive structure G is galvanically connected with the ground of the capacitive measuring device.

The ground electrode $E_M$ can be connected with the ground of the capacitive measuring device by means of a second switch $S_2$ of the switching device. During the first measurement cycle previously described, the second switch $S_2$ is open, that is, the ground electrode $E_M$ is not galvanically connected with the ground of the capacitive measuring device.

In a second measurement cycle, instead of the electrically conductive structure G, the ground electrode $E_M$ is connected with the ground of the capacitive measuring device. For this purpose, the first switch $S_1$ is opened and the second switch $S_2$ is closed. During the second measurement cycle, sensor signals are also detected in the sensor electrodes of the sensor surface A. In this switching process (opening of the first switch $S_1$ and closing of the second switch $S_2$), the sensor signals detected in the sensor electrodes of the sensor surface A undergo a common-mode interference. When commuting the ground of the electrically conductive structure G at the ground electrode $E_M$, the sensor signal detected or the sensor data measured in the sensor electrodes of the sensor surface also change due to the changed capacitive conditions.

The connection between the ground electrode $E_M$ and the electrically conductive structure G is indicated in FIG. 1 as an equivalent capacitance $C_M$. When switching the ground of the capacitive measuring device from the electrically conductive structure G to the ground electrode $E_M$, a reduction is detected in the signal level of the electrical signals measured in the sensor electrodes of the sensor surface A. The condition for this is that the connection between the hand and the electrically conductive structure G is greater than the connection between the hand and the ground electrode $E_M$. This can be achieved by choosing the ground electrode $E_M$ to be substantially smaller than the electrically conductive structure G.

Depending on the design of the electrically conductive structure G or the ground electrode $E_M$, a level rise in the sensor signals measured can occur with the switching of the ground of the capacitive measuring device from the electrically conductive structure G to the ground electrode $E_M$. Regardless of whether the switching of the ground leads to a level rise or to a level reduction of the electric signals measured or detected in the sensor electrodes, the switching of the ground causes a common-mode interference in the sensor signals measured, which is used for detecting a grip of the hand-held device.

It is especially advantageous in the capacitive measuring device according to the invention that no additional analogue front-end has to be provided for the ground electrode $E_M$, as the ground electrode $E_M$ has to be connected with the capacitive measuring device only by means of a switch, that is, it must be galvanically connected with the ground of the capacitive measuring device.

The measuring signal of sensor electrode depends on its capacity load. In this case, this load must be understood as the capacitance between the sensor electrode and the ground of the circuit, as generally the circuit is not galvanically connected with earth. In the simple "normal case", in other words, when there is no ground electrode $E_M$ and the ground GND of the circuit is directly connected with the conductive housing, this capacity is formed by the series connection of the sensor electrode-hand $C_{H1}$ and hand-housing $C_{H3}$ capacities.

FIG. 1a shows the simplified diagram of the application. $C_{H1}$, $C_{H2}$, $C_{H3}$ are the capacitances of the user's hand (hands) to the sensor electrode, ground electrode or housing. For the capacitive load of the sensor electrode that determines the sensor signal, the following expressions are valid (the parallel connection of the capacitor is indicated with "||" and the series connection with "⊕"):

a) For the first measurement cycle (ground to housing):

$$C_{sensor\ electrode} = C_{H1} \oplus (C_{H3} || (C_{H2} \ominus (C_M || C_S)))$$

b) For the second measurement cycle (ground to ground electrode):

$$C_{sensor\ electrode} = C_{H1} \oplus (C_{H2} || (C_{H3} \oplus (C_M || C_S)))$$

It will be apparent from the formula that, depending on whether $C_{H2}$ or $C_{H3}$ is higher, the difference of the signals is negative or positive when changing the measurement cycles.

From the signal level of the sensor signal detected in the first measurement cycle and the signal level of the sensor signal detected in the second measurement cycle, it is possible to infer a grip or a holding of the electric hand-held device. Thus, a difference between the signal levels and first sensor signals (of the first measurement cycle) and the signal level of second sensor signals (of the second measurement cycle) is determined. The amount of the difference is indicative in this case of the approach of a hand to the hand-held device. If the amount of the difference is lower than a predetermined value, an approach of a hand to the hand-held device can be inferred therefrom. If a hand-held device is held by a hand, the capacitive connection between the ground electrode EM and the electrically conductive structure G increases due to the additional connection via the hand. In the case considered (surface(G)>>surface(EM), =>$C_{H3}$>>$C_{H2}$, $C_M$~$C_{H2}$, $C_M$>>$C_S$), the load capacitance of the sensor electrode can be described approximately as follows:

a) for the first measurement cycle (ground to housing):

$$C_{sensor\ electrode} \approx C_{H1} \oplus C_{H3}$$

b) for the second measurement cycle (ground to ground electrode):

$$C_{sensor\ electrode} \approx C_{H1} \oplus (C_{H2} \| C_M)$$

It will be apparent that the better the capacitive connection $C_{H2}$ is, the higher the load capacitance of the sensor electrode will be during the second measurement cycle, so that the amount of the difference between the signal level of both sensor signals decreases.

Instead of or alternatively to the difference, it is also possible to define a threshold value, in which a crossing (or alternately a falling below) of the threshold value of the signal level of the second signals is indicative of the approach of a hand to the hand-held device. Several threshold values can be also defined with different signal levels in different sensor electrodes.

Figure 1B:
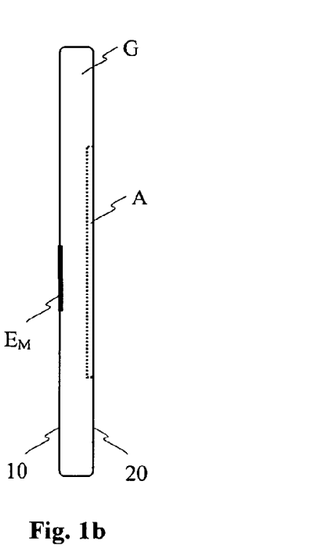
FIG. 1b shows a side view of an electric hand-held device with a ground electrode placed on the back side.

FIG. 1b shows an arrangement of a ground electrode $E_M$ in an electric hand-held device, where the ground electrode $E_M$ is arranged in the back side 10 of the hand-held device. A sensor surface A, for example, can be arranged on the front side 20 of the hand-held device. If the device is held by a hand, the surface of a hand approaches the ground electrode $E_M$ arranged on the back side 10 of the hand-held device, so that a grip of the hand-held device can be detected with the method previously disclosed from the sensor signals measured by the sensor electrodes of the sensor surface A. For this purpose, the first switch $S_1$ is opened and the second switch $S_2$ is closed, so that the ground electrode $E_M$ is galvanically connected with the ground of the capacitive measuring device.

Figure 2A:
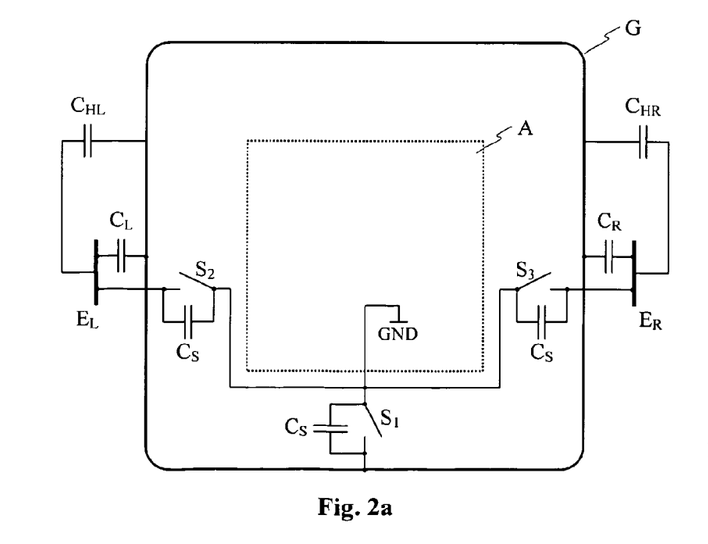
FIG. 2a shows an equivalent-circuit diagram of a second embodiment of a capacitive measuring device according to the invention.
Figure 2B:
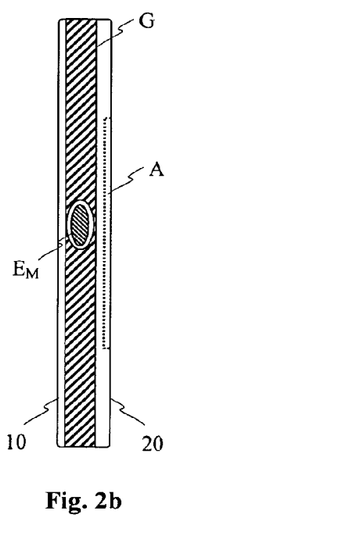
FIG. 2b shows a housing of a hand-held device from a side view with an electric conductive structure and a ground electrode.

FIG. 2a shows an equivalent-circuit diagram of a capacitive measuring device according to the invention for a hand-held device, in which the capacitive measuring device is galvanically connectable with two ground electrodes $E_L$, $E_R$. Preferably, a ground electrode is arranged on each side of the hand-held device. For example, a first ground electrode $E_L$ is arranged on the left wall of the housing of the hand-held device and a second ground electrode $E_R$ on the right wall of the housing of the-hand held device. Thereby, in an advantageous way, a distinction can be made on whether the hand-held device is held with a left hand or with a right hand.

This is possible because the capacitive conditions of connection to the ground electrodes $E_L$, $E_R$ are modified depending on whether the hand-held device is held by a left hand or by a right hand. The ground electrodes $E_L$ and $E_R$ are respectively connectable with the ground of the capacitive measuring device by means of a switch $S_2$ or $S_3$ of a switching device. The left ground electrode has a coupling capacitance $C_L$ to the electrically conductive structure G of the hand-held device. The right ground electrode $E_R$ has a coupling capacitance $C_R$ to the electrically conductive structure G of the electric hand-held device.

In the normal operation of the electric hand-held device or the capacitive measuring device, the ground of the capacitive measuring device is galvanically connected with the electrically conductive structure G of the hand-held device, i.e. the switch S1 is closed. Furthermore, in normal operation, the switches $S_2$ and $S_3$ are open, so that the ground electrodes $E_L$ or $E_R$ show no galvanic connection to the ground of the capacitive measuring device. First electric sensor signals DS1 are detected or measured in the sensor electrodes of the sensor surface.

In order to detect with which hand (right or left) the hand-held device is held, the switch $S_1$ is firstly opened and the switch $S_2$ is closed, the switch $S_3$ being equally open. Thereby the (left) ground electrode $E_L$ is galvanically connected with the ground of the sensor device. The opening of the switch $S_1$ and the closing of the switch $S_2$ leads to a common mode interference of the electric signals (second sensor signals $DS2_L$) measured in the sensor electrodes of the sensor surface. The raw values $u_i$ ($E_L$) of the second sensor signal $DS2_L$, for i=1, 2, . . . , $N_{EL}$, where $N_{EL}$ is the number of sensor electrodes used in a following step in order to determine whether the hand-held device is held by a left hand or by a right hand.

In another measuring step, the switch $S_2$ is opened and the switch $S_3$ is closed, the switch $S_1$ being open. Thereby the (right) ground electrode $E_R$ is galvanically connected with the ground of the sensor device. In this other measuring step, sensor signals (second sensor signals $DS2_R$) are also measured in the sensor electrodes, whose raw values $u_i$ ($E_R$), for i=1, 2, . . . , $N_{ER}$, being $N_{ER}$ the number of sensor electrodes (always $N_{ER}$=$N_{EL}$), are used in the next step to determine whether the hand-held device is held by a left hand or by a right hand.

In this further step, the raw value $u_i$($E_L$) is compared with the raw value $u_i$ ($E_R$) for every i, where $u_i$ is the measuring value of the sensor signal measured in the i-th sensor electrode.

In this step, the raw values $u_i$ ($E_0$), for i=1, 2, . . . , $N_{E0}$, being $N_{E0}$ the number of sensor electrodes (always $N_{E0}$=$N_{ER}$=$N_{EL}$), of the first sensor signal DS1 can be considered. $u_i$ ($E_0$) is the measured value of the sensor signal measured in the i-th sensor electrode, when no ground electrode is galvanically connected with the ground of the sensor device. In this case, a first difference for the second sensor signal $DS2_L$ and a second difference for the second sensor signals $DS2_R$ are determined. If the first difference is higher in amount than the second difference ($|u_i$ ($E_L$)-$u_i$ ($E_0$)|>|$u_i$ ($E_R$)-$u_i$ ($E_0$)|), it can be concluded that the hand-held device is held in the right hand.

In order to allow also a distinction between the case in which the hand-held device is held with two hands in a substantially symmetrical way, and the case in which the hand-held device is not held by any hand, absolute changes of the detected raw signals $u_i$ ($E_L$), $u_i$ ($E_R$) can also be taken into account.

FIG. 2b shows a side view of a hand-held device. Here an electrically conductive structure G of the hand-held device is represented, which is arranged under the surface of the housing and surrounds the housing on the edge. The electrically conductive structure G can be designed for example as a foil. Alternately it can be applied as an electrically conductive coating in the inner side of the housing shell. In a particular embodiment of the invention, the electrically conductive structure G can be formed also by the housing or by the housing shell itself, for example, by a metallic housing.

Also a ground electrode $E_M$ is arranged on the housing. If two ground electrodes are provided, as it is shown in FIG. 2a, a ground electrode ($E_R$) can be arranged on the right wall of the housing and the other ground electrode ($E_L$) on the left wall of the housing.

The ground electrode or ground electrodes are not galvanically connected with the electrically conductive structure G, in other words, the ground electrodes are arranged electrically isolated from the electrically conductive structure G.

In the example shown in FIG. 2b, the electrically conductive structure G has a recess, in which the ground electrode is arranged. It is important that the surface of the ground electrode is substantially different from the surface of the electrically conductive structure G, so that $C_{H3} \gg C_{H2}$ (or $C_{H3} \ll C_{H2}$) is also valid. In FIG. 2b, the surface of the ground electrode EM is considerably smaller than the surface of the electrically conductive structure G. Besides an oval-shaped design, the ground electrode $E_M$ can also be of any other suitable shape.

Figure 4:
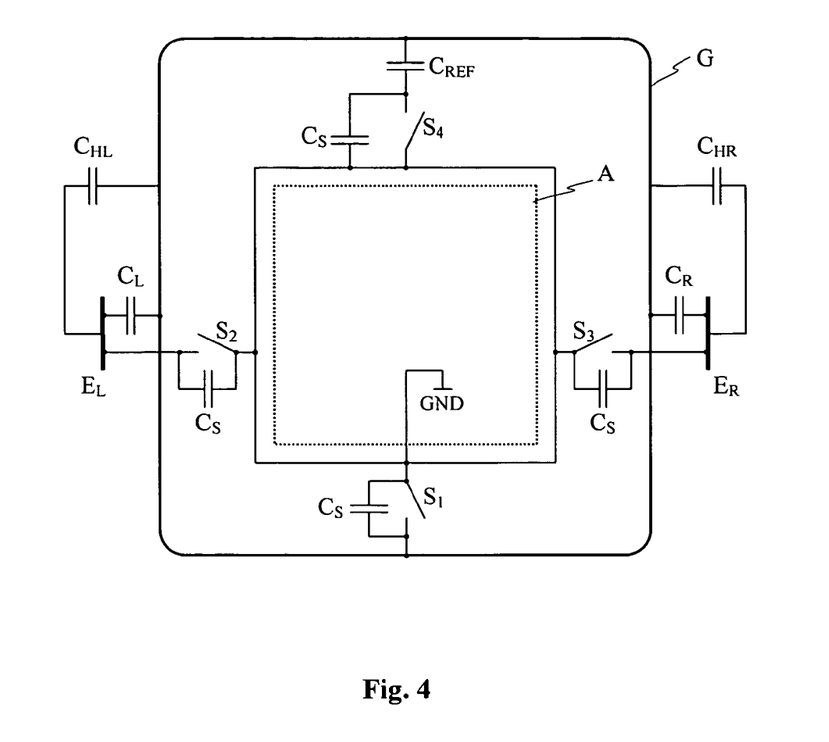
FIG. 4 shows an equivalent-circuit diagram of another embodiment of a capacitive measuring device according to the invention.

FIG. 4 shows another embodiment of a capacitive measuring device according to the invention, that provides further measures with which absolute reference values of the raw signal can be obtained in order to eliminate the ambiguity in the case $u_i(E_L) = u_i(E_R)$.

In order to obtain an absolute reference for the raw values measured in the sensor electrodes in case of a connection of the ground of the capacitive measuring device with the ground electrodes $E_L$ or $E_R$ without hand connection, a reference capacitance $C_{REF}$ is provided, the capacitance of which is known. The reference capacity $C_{REF}$ is galvanically connected with the electrically conductive structure. The reference capacitance $C_{REF}$ is also galvanically connectable with the ground of the capacitive measuring device by means of a switch S4.

In a calibration step, a reference sensor signal (third sensor signal DS3) can be detected on the sensor electrodes of the sensor surface A with the switches $S_1$, $S_2$ and $S_3$ opened and with switch $S_4$ closed. The signal level of the reference signal thus detected can be used as a reference signal level (with the raw values $u_i(C_{REF})$, for $i=1, 2, \ldots, N_{REF}$, being $N_{REF}$ the number of sensor electrodes—always $N_{REF} = N_{E0} = N_{ER} = N_{EL}$), in order to distinguish if the hand-held device is held by a hand or by no hand in $u_i(E_L) = u_i(E_R)$. Advantageously, the reference capacitance $C_{REF}$ is chosen in such a way that its capacitance substantially corresponds to the capacitance $C_L$ or $C_R$, where $C_L$ and $C_R$ represent the capacitive connection of the ground electrodes $E_L$ or $E_R$ to the electrically conductive structure.

So, the capacitance charges of the sensor electrodes with switch S4 closed and switches S1, S2, S3 opened correspond approximately to the capacitance charge with the switch S2 closed and switches S1, S3, S4 opened, when no hand/finger is near the left ground electrode $E_L$. Thus, the corresponding sensor signals are also approximately the same in these switch positions. The same is valid for the right ground electrode $E_R$.

Being $|u_i(E_0) - u_i(C_{REF})| > |u_i(E_0) - u_i(E_L)|$ and/or $|u_i(E_0) - u_i(C_{REF})| > |u_i(E_0) - u_i(E_R)|$, it can be inferred that the hand-held device is held with one hand and/or with both hands.

With the additional reference capacitance $C_{REF}$ it is possible to determine if the hand-held device is really held by a hand, and if so, if the hand-held device is held only with the right hand, only with the left hand or with both hands. Additionally, the approach or grip thus can also be detected if only a ground electrode is provided.

All the switches $S_1$ to $S_4$ of the switching device each show a parasitic switch capacitance $C_S$ connected parallelly to the respective switch. Preferably the switch capacitance is significantly lower than the coupling capacitances $C_L$ and $C_R$ between the ground electrodes $E_L$ or $E_R$ and the housing ($C_S \ll C_L, C_R$). In this case, the raw values that are detected, with the switch $S_2$ closed, for the left ground electrode $E_L$, are nearly independent of the hand connection $C_{HR}$ between the right ground electrode $E_R$ and the housing, and vice versa.

In order to further improve the robustness of the detection, it can be necessary to consider tolerance thresholds $\epsilon_i$ for the raw values measured or detected. Thus, construction-related imprecisions or noises can be considered when comparing the raw values. When comparing the raw values with the inclusion of the tolerance thresholds the equation thus is $\epsilon_i$, $|u_i(E_L)|$, $|u_i(E_R)| > |u_i(C_{REF}) + \epsilon_i|$. The tolerance threshold $\epsilon_i$ can be determined for example empirically.

In a particular embodiment of the capacitive measuring device according to the invention, it is possible to do without the reference capacitance $C_{REF}$ if the tolerance threshold $\epsilon_i$ is chosen appropriately. In this case the raw value measured with switches $S_1$, $S_2$ and $S_3$ opened can be used as a raw reference value.

According to the method according to the invention previously disclosed, for the detection of the grip, the switch $S_1$ is opened and switches $S_2$ or $S_3$ are closed in order to detect the grip of a hand-held device from the sensor signals resulting.

Alternately, the three switches $S_1$, $S_2$ and $S_3$ can also be closed in the normal operation of the hand-held device or of the capacitive measuring device according to the invention. In order to detect a grip of the hand-held device by a hand or in order to detect in which hand the hand-held device is held, switch $S_2$ can then be opened (being switches $S_1$ and $S_3$ closed) firstly and the sensor signals measured in the sensor electrodes are analyzed. Next, switch $S_3$ can be opened (being $S_1$ and $S_2$ closed) and the sensor signals resulting therefrom are evaluated. The sensor signals thus obtained can be compared to each other as previously disclosed, for the purpose of detecting the grip or detecting the hand that holds the hand-held device.

Figure 3:
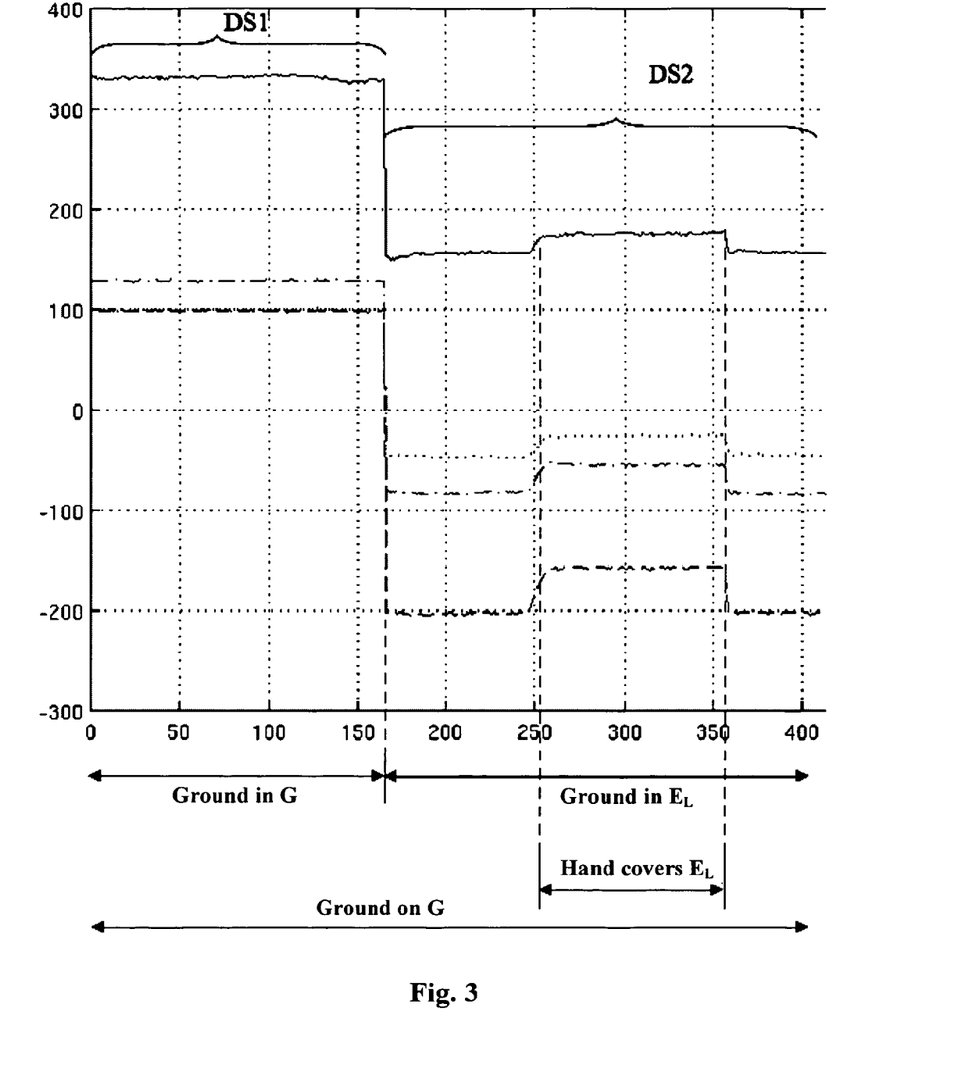
FIG. 3 shows the time sequence of electric signals measured in the sensor electrodes (measuring electrodes), depending on how the hand-held device is held.

FIG. 3 shows a time sequence of the raw signals, in which the ground of the capacitive measuring device is initially galvanically connected with the housing and then galvanically connected with the ground electrode $E_L$. Here sensor data of the 4 sensor electrodes arranged on a common sensor surface are shown and where the oldest values are put on the left and the most recent values on the right.

Firstly, the ground of the capacitive measuring device is connected with the housing (i.e. electrically conductive structure) (sample 0 up to approx. sample 170). A hand surrounds the housing. If the ground of the capacitive measuring device is commuted from the housing to the ground electrode (approximately in sample 170), the sensor data of all the sensor electrodes decrease distinctly. Between sample 170 and sample 255 the hand does not surround the ground electrode, that is, the hand is far from the ground electrode $E_L$. If the ground electrode $E_L$ is covered by a hand, all the sensor data rise (between sample 255 and sample 360). If the hand is removed again from the ground electrode, the sensor data decrease again (between sample 360 and sample 400).

With the capacitive measuring device according to the invention or with the measurement method according to the invention, in the determination of the position of a fingertip relative to the sensor surface it can be taken account of from which side the corresponding finger projects into the sensor surface. Therefore, the distortion of the alternating electric field in the sensor surface, which is caused by means of a finger extending laterally into the sensor surface, can be even better taken account of when determining the position of the fingertip relative to the sensor surface. Thus, an even better position determination is possible. Furthermore, a user interface of an electric hand-held device can be adjusted depending on the hand in which the device is held. As it is possible to distinguish between the grip of a hand-held device with both hands or with no hand, a user interface can also be correspondingly adapted for these cases.

Another advantage is that, except for the further necessary ground electrodes and the switches necessary for this purpose, no further reception electronics is needed for the connection of the ground electrodes with the ground of the capacitive measuring device, so that construction costs and production costs are kept within limits. An approach of a hand to the bottom of a housing, for example, can also be detected without having to provide any additional measuring channels for this purpose. It is enough to arrange one ground electrode on the bottom of the housing.

Embodiments of the measuring device according to the invention with one ground electrode $E_M$ or with two ground electrodes $E_L$, $E_R$ have been shown. According to the invention, more than two ground electrodes can also be provided.

Thus four ground electrodes $E_{L1}$, $E_{L2}$, $E_{R1}$, $E_{R2}$, for example, can be provided, where the ground electrodes $E_{L1}$, $E_{L2}$ can be arranged on a left housing wall and the ground electrodes $E_{R1}$, $E_{R2}$ on a right housing wall. On the left housing wall or on the right housing wall, an electrode $E_{L1}$ or $E_{R1}$ can be respectively arranged on the upper region of the housing and an electrode $E_{L2}$ or $E_{R2}$ can be respectively arranged on the lower region of the housing. Thus, a distinction is possible of whether a finger, for example, extends into the sensor surface from the top right or from the bottom left. It can also be determined if a finger extends into the sensor surface laterally substantially between the electrodes (e.g. between $E_{L1}$ and $E_{R1}$).

The hand-held device or electric hand-held device can be, for example, a smartphone, a mobile radio unit, a remote control device, a digital camera, particularly a digital camera with touchscreen, a game controller or a game console with touchscreen, a portable minicomputer, a tablet PC, or similar.

What is claimed is:

1. Capacitive measuring device for a hand-held device, particularly an electric hand-held device, for the detection of an approach to the hand-held device, wherein
   the capacitive measuring device has a switching device,
   the ground of the capacitive measuring device is galvanically connectable with an electrically conductive structure of the hand-held device by the switching device, and
   the capacitive measuring device has a ground electrode structure that is arranged on the hand-held device with at least one ground electrode, wherein the ground of the capacitive measuring device is galvanically connectable with the at least one ground electrode by the switching device.

2. The capacitive measuring device according to claim 1, wherein the switching device is adapted to galvanically connect
   the electrically conductive structure or
   at least one ground electrode of the ground electrode structure
   neither the electrically conductive structure nor a ground electrode of the ground electrode structure
   with the ground of the capacitive measuring device.

3. The capacitive measuring device according to claim 1, wherein the ground electrode structure has at least one first ground electrode and at least one second ground electrode, which are arranged at the hand-held device in such a way that when the hand-held device is held by a hand, at least one of the two ground electrodes is at least partially covered by the hand.

4. Capacitive measuring device according to claim 3, wherein the first and second ground electrodes are arranged inside a housing of the hand-held device.

5. The capacitive measuring device according to claim 1, wherein the switching device has a switch for every ground electrode of the ground electrode structure and for the electrically conductive structure, respectively, wherein each switch comprises a switching element.

6. The capacitive measuring device according to claim 1, wherein the capacitive measuring device has a reference capacitance that is galvanically connected with the electrically conductive structure and that is galvanically connected with the ground of the capacitive measuring device by means of a switch, comprising a switching element.

7. The capacitive measuring device according to claim 6, wherein a reference capacitance and a coupling capacitances are essentially equal.

8. The capacitance measuring device according to claim 1, wherein a switching capacitance of switching elements is significantly lower than coupling capacitances.

9. A method for the detection of an approach of a hand to a hand-held device, particularly an electric hand-held device, with a capacitive measuring device, wherein the capacitive measuring device has a ground electrode structure with at least one ground electrode and at least one sensor electrode and wherein
   in a first measurement cycle, the ground of the capacitive measuring device is galvanically connected with an electrically conductive structure of the hand-held device and first sensor signals are received from the at least one sensor electrode,
   in a second measurement cycle, the ground of the capacitive measuring device is galvanically connected with at least one ground electrode of the ground electrode structure and second sensor signals are received from the at least one sensor electrode, and
   a difference between the signal level of the first sensor signal and the second sensor signal is determined, wherein the difference is indicative of the approach of the hand to the hand-held device.

10. The method according to claim 9, wherein at least in the second measurement cycle, the electrically conductive structure is connectable with the ground of the capacitive measurement device through a reference capacitance.

11. The method according to claim 10, wherein the reference capacitance and coupling capacitances between the ground electrodes and the electrically conductive structure are chosen such that they are essentially equal.

12. The method according to claim 10, wherein the ground electrodes, the reference capacitance and the electrically conductive structure, respectively are connectable through a switch, comprising a switching element, with the ground of the capacitive measuring device, wherein switching capacitances of the switching elements are chosen in such a way that they are significantly lower than coupling capacitances between the ground electrodes and the electrically conductive structure.

13. The method according to claim 10, wherein in a calibration step, the electrically conductive structure is connected with the ground of the capacitive measuring device through the reference capacitance, and a third sensor signal is received from the at least one sensor electrode, which serves as a reference sensor signal for the at least one ground electrode, wherein a signal level of the second sensor signal associated with the at least one ground electrode is indicative of an approach to the at least one ground electrode, when the difference between the signal level of the first sensor signal and that of the third sensor signal is greater than the difference between the signal level of the first sensor signal and that of the second signal of sensor.

14. The method according to claim 13, wherein at least a third sensor signal is corrected by a tolerance value.

15. A method for the detection of an approach of a hand to a hand-held device, particularly an electric hand-held device, with a capacitive measuring device, wherein the capacitive measuring device has at least one sensor electrode and a ground electrode structure comprising at least one first ground electrode and at least one second ground electrode that are arranged on the hand-held device in such a way that, with the grip of the hand-held device by a hand, at least one of the two ground electrodes is at least partially covered by that hand, wherein, in a first measurement cycle, the ground of the capacitive measuring device is galvanically connected with an electrically conductive structure of the handheld device and first sensor signals are received from the at least one sensor electrode, wherein in a second measurement cycle:
firstly, the first ground electrode is galvanically connected with the ground of the capacitive measuring device and second sensor signals associated to the first ground electrode are received from the at least one sensor electrode, next, the second ground electrode is galvanically connected with the ground of the capacitive measuring device and second sensor signals associated to the second ground electrode are received from the at least one sensor electrode, and a first difference between the signal level of the second sensor signals associated to the first ground electrode and that of the first sensor signal is compared with a second difference between the signal level of the second sensor signals associated to the second ground electrode and that of the first sensor signal, wherein a difference between the first difference and the second difference is indicative of which of the two ground electrodes is covered by the hand.

16. The method according to claim 15, wherein at least in the second measurement cycle, the electrically conductive structure is connectable with the ground of the capacitive measurement device through a reference capacitance.

17. The method according to claim 16, wherein the reference capacitance and coupling capacitances between the ground electrodes and the electrically conductive structure are chosen such that they are essentially equal.

18. The method according to claim 16, wherein the ground electrodes, the reference capacitance and the electrically conductive structure, respectively are connectable through a switch, comprising a switching element, with the ground of the capacitive measuring device, wherein switching capacitances of the switching elements are chosen in such a way that they are significantly lower than coupling capacitances between the ground electrodes and the electrically conductive structure.

19. The method according to claim 16, wherein in a calibration step, the electrically conductive structure is connected with the ground of the capacitive measuring device through the reference capacitance, and a third sensor signal is received from the at least one sensor electrode, which serves as a reference sensor signal for the first or second ground electrode, wherein a signal level of the second sensor signal associated with the at least one first or second ground electrode is indicative of an approach to the at least one first or second ground electrode, when the difference between the signal level of the first sensor signal and that of the third sensor signal is greater than the difference between the signal level of the first sensor signal and that of the second signal of sensor.

20. The method according to claim 19, wherein at least a third sensor signal is corrected by a tolerance value.

* * * * *